(12) United States Patent
Kim et al.

(10) Patent No.: US 11,711,962 B2
(45) Date of Patent: Jul. 25, 2023

(54) FLEXIBLE DISPLAY APPARATUS HAVING ALIGNMENT MARK AND METHOD OF ASSEMBLING THE SAME

(71) Applicant: Samsung Display Co., LTD., Yongin-si (KR)

(72) Inventors: Young Kwan Kim, Seoul (KR); Bohyuk Lee, Yongin-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 0 days.

(21) Appl. No.: 17/314,387

(22) Filed: May 7, 2021

(65) Prior Publication Data
US 2021/0265433 A1    Aug. 26, 2021

Related U.S. Application Data

(63) Continuation of application No. 16/679,457, filed on Nov. 11, 2019, now Pat. No. 11,004,912.

(30) Foreign Application Priority Data

Nov. 28, 2018    (KR) .......................... 10-2018-0149274

(51) Int. Cl.
*H01L 27/14*    (2006.01)
*H01L 27/32*    (2006.01)
(Continued)

(52) U.S. Cl.
CPC ........ *H01L 27/3223* (2013.01); *G06F 3/0412* (2013.01); *H01L 27/323* (2013.01);
(Continued)

(58) Field of Classification Search
CPC ......... G06F 3/0412; G06F 2203/04102; G06F 2203/04103; G06F 3/0445; G06F 1/1616; G06F 1/1641; H01L 27/323; H01L 27/3223; H01L 27/3276; H01L 51/0097; H01L 51/56; H01L 2227/323; H01L 2251/5338; H01L 27/3225; H01L 23/544;
(Continued)

(56) References Cited

U.S. PATENT DOCUMENTS

| 9,368,745 B2 | 6/2016 | Lee et al. |
| 9,769,919 B2 | 9/2017 | Park et al. |
| 11,094,916 B2 | 8/2021 | Jeong et al. |
| 2017/0278452 A1* | 9/2017 | Oh ....................... G09G 3/2092 |

(Continued)

FOREIGN PATENT DOCUMENTS

| CN | 107479272 | * 12/2017 |
| CN | 106105388 | * 7/2018 |

(Continued)

*Primary Examiner* — Tan N Tran
(74) *Attorney, Agent, or Firm* — Cantor Colburn LLP

(57) ABSTRACT

A flexible display apparatus includes a flexible display panel including a flexible substrate, a display area of the flexible substrate including a thin film transistor, an organic light emitting layer and a sensor electrode, and a peripheral area of the flexible substrate including a first alignment mark in which respective portions of two metal layers are stacked; a window on a first surface of the flexible display panel; and a protective film on a second surface of the flexible display panel. The first alignment mark is aligned with a reference point of the window and with a reference point of the protective film.

12 Claims, 11 Drawing Sheets

(51) Int. Cl.
  *H01L 51/00* (2006.01)
  *H01L 51/56* (2006.01)
  *G06F 3/041* (2006.01)

(52) U.S. Cl.
  CPC ...... *H01L 27/3276* (2013.01); *H01L 51/0097* (2013.01); *H01L 51/56* (2013.01); *G06F 2203/04102* (2013.01); *G06F 2203/04103* (2013.01); *H01L 2227/323* (2013.01); *H01L 2251/5338* (2013.01)

(58) Field of Classification Search
  CPC ....... H01L 27/3244; H01L 2223/54426; Y02E 10/549; Y02P 70/50; G09F 9/301; G02F 1/1303
  USPC ..................................................... 257/59, 72
  See application file for complete search history.

(56) References Cited

U.S. PATENT DOCUMENTS

| | | | |
|---|---|---|---|
| 2017/0352834 A1 | 12/2017 | Kim | ................. H01L 27/3276 |
| 2018/0151845 A1 | 5/2018 | Jeong et al. | |

FOREIGN PATENT DOCUMENTS

| | | | |
|---|---|---|---|
| JP | 2003041215 | * | 2/2003 |
| JP | 2009192667 | A | 8/2009 |
| KR | 1020070062079 | A | 6/2007 |
| KR | 1020070069462 | A | 7/2007 |
| KR | 1020140065284 | A | 5/2014 |
| KR | 1020150014713 | A | 2/2015 |
| KR | 1020150136662 | A | 12/2015 |
| KR | 10-20160062368 | * | 6/2016 |
| KR | 1020180061483 | A | 6/2018 |

\* cited by examiner

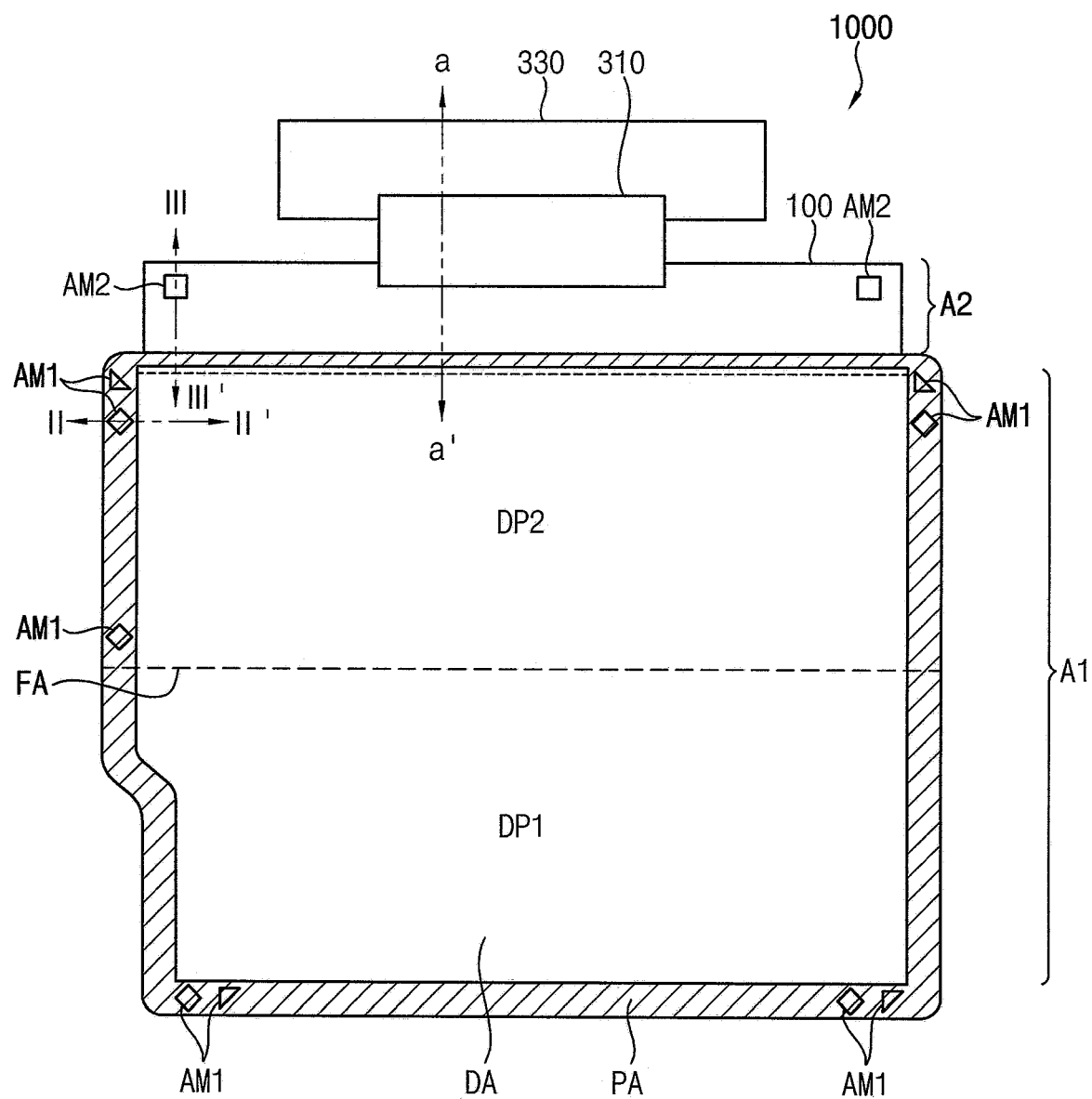

FLEXIBLE DISPLAY APPARATUS HAVING ALIGNMENT MARK AND METHOD OF ASSEMBLING THE SAME

This application is a continuation application of U.S. patent application Ser. No. 16/679,457 filed on Nov. 11, 2019 and issued as U.S. Pat. No. 11,004,912 on May 11, 2021, which claims priority to Korean Patent Application No. 10-2018-0149274 filed on Nov. 28, 2018, and all the benefits accruing therefrom under 35 U.S.C. § 119, the content of which in its entirety is herein incorporated by reference.

BACKGROUND

1. Field

Exemplary embodiments relate to a flexible display apparatus. More particularly, exemplary embodiments relate to a flexible display apparatus having an alignment mark used in a module-assembling process and a method of assembling the flexible display apparatus using the same.

2. Description of the Related Art

A flat panel display device includes a liquid crystal display ("LCD") device and an organic light emitting display ("OLED") device. The organic light emitting display has an excellent luminance and viewing angle characteristics and does not include a separate back light as compared with the liquid crystal display, so that the organic light emitting display may be realized as an ultra-thin type of display device. In the organic light emitting display device, an electron injected through a cathode and an anode is recombined with holes in an organic thin film to form an exciton. The organic light emitting display device uses a phenomenon in which a light of a specific wavelength is generated by energy from the exciton.

A flexible display apparatus is being developed by forming display areas, signal lines, etc. on a flexible substrate which includes materials such as flexible plastic materials.

SUMMARY

Exemplary embodiments provide a flexible display apparatus including an alignment mark with improved visibility.

Exemplary embodiments provide a method of assembling a flexible display apparatus using an alignment mark thereof with improved visibility.

According to an exemplary embodiment, a flexible display apparatus includes a flexible display panel including a flexible substrate including a plastic layer, a display area of the flexible substrate including a thin film transistor, an organic light emitting layer, and a sensor electrode on the flexible substrate, and a peripheral area of the flexible substrate adjacent to the display area, the peripheral area including a first alignment mark in which respective portions of two metal layers are stacked; a window on a first surface of the flexible display panel, the window including a reference point defined along the window, a transmissive window corresponding to the display area and a light shielding part corresponding to the peripheral area; and a protective film on a second surface of the flexible display panel which is opposite to the first surface thereof, the protective film including a reference point defined along the protective film. The first alignment mark is aligned with the reference point of the window and with the reference point of the protective film.

In an exemplary embodiment, the flexible display panel may further include a signal line which is in the display area and to which a display signal is provided, an extension area extended from the peripheral area in a direction away from the display area, and a pad in the extension area, through which the display signal is transmitted from outside the flexible display panel to the signal line in the display area.

In an exemplary embodiment, the extension area of the flexible display panel may further include a second alignment mark in which respective portions of two metal layers are stacked, the two metal layers of the first alignment mark being different from the two metal layers of the second alignment mark.

In an exemplary embodiment, the flexible display apparatus may further include a flexible circuit board from which the display signal is provided to the flexible display panel, and a circuit mounting film connected to the flexible circuit board and to the pad in the extension area the flexible display panel, and through which the display signal from the flexible circuit board is transmitted to the pad.

In an exemplary embodiment, the flexible display apparatus may further include a metal plate facing the second surface of the flexible display panel. The flexible display panel which is bent may dispose the metal plate between the extension area of the flexible display panel and the protective film on the second surface of the flexible display panel.

In an exemplary embodiment, the second alignment mark may be aligned with a reference point of each of the circuit mounting film, the flexible circuit board and the metal plate.

In an exemplary embodiment, the flexible display apparatus may further include a polarizing member between the flexible display panel and the window.

In an exemplary embodiment, the first alignment mark may be further aligned with a reference point of the polarizing member which is defined along the polarizing member.

In an exemplary embodiment, the display area of the flexible display panel may include a folding axis about which the flexible display panel is bendable.

In an exemplary embodiment, the first alignment mark and the second alignment mark may each include a portion of a first metal layer, a portion of a second metal layer, a portion of a third metal layer and a portion of a fourth metal layer sequentially which are sequentially stacked on the flexible substrate.

In an exemplary embodiment, the thin film transistor may include a gate electrode and a source electrode, the sensor electrode may include a first touch electrode and a second touch electrode, the gate electrode, the first alignment mark and the second alignment mark may each include respective portions of a same first metal layer, the source electrode, the first alignment mark and the second alignment mark may each include respective portions of a same second metal layer, the first touch electrode, the first alignment mark and the second alignment mark may each include respective portions of a same third metal layer, and the second touch electrode, the first alignment mark and the second alignment mark may each include respective portions of a same fourth metal layer.

According to an exemplary embodiment, a method of assembling a flexible display apparatus includes providing a flexible display panel including a flexible substrate including a plastic layer, a display area of the flexible substrate including a thin film transistor, an organic light emitting layer, and a sensor electrode on the flexible substrate, and a peripheral area of the flexible substrate adjacent to the display area, the peripheral area including a first alignment mark in which respective portions of two metal layers are stacked. The method may include attaching a polarizing member on a first surface of the flexible display panel using the first alignment mark, attaching a window on the first surface of the flexible display panel using the first alignment mark, and attaching a protective film on a second surface of the flexible display panel using the first alignment mark.

In an exemplary embodiment, the attaching the polarizing member may include providing the polarizing member on the flexible display panel and generating an alignment image of the first alignment mark by using light which is transmitted or reflected at an area of the flexible display at which the first alignment mark is provided, and aligning the first alignment mark and a reference point of the polarizing member using the alignment image of the first alignment mark.

In an exemplary embodiment, the attaching the window may include providing the window on the flexible display panel and generating an alignment image of the first alignment mark by using light which is reflected at an area of the flexible display at which the first alignment mark is provided, and aligning the first alignment mark and a reference point of the window using the alignment image of the first alignment mark.

In an exemplary embodiment, the attaching the protective film may include providing the protective film on the flexible display panel and generating an alignment image of the first alignment mark by using light which is reflected at an area of the flexible display at which the first alignment mark is provided, and aligning the first alignment mark and a reference point of the protective film using the alignment image of the first alignment mark.

In an exemplary embodiment, the flexible display panel further may include a signal line which is in the display area and to which a display signal is provided, an extension area extended from the peripheral area in a direction away from the display area, a pad in the extension area, through which the display signal is transmitted from outside the flexible display panel to the signal line in the display area and a second alignment mark which is in the extension area and in which respective portions of two metal layers are stacked, the two metal layers of the first alignment mark being different from the two metal layers of the second alignment mark. The method may further include attaching a circuit mounting film on the extension area using the second alignment mark, and attaching a metal plate on the protective film using the second alignment mark.

In an exemplary embodiment, the attaching the circuit mounting film may include providing the circuit mounting film on the flexible display panel and generating an alignment image of the second alignment mark by using light which is transmitted or reflected at an area of the flexible display at which the second alignment mark is provided, and aligning the second alignment mark and the circuit mounting film using the alignment image of the second alignment mark.

In an exemplary embodiment, the attaching the metal plate may include providing the metal plate on the flexible display panel and generating an alignment image of the second alignment mark by using light which is reflected at an area of the flexible display at which the second alignment mark is provided, and aligning the second alignment mark with a reference point of the metal plate using the alignment image of the second alignment mark.

In an exemplary embodiment, the method may further include bending the extension area of the flexible display panel having the metal plate attached to the protective film, toward the metal plate, generating an alignment image of the second alignment mark by using light which is reflected at an area of the flexible display at which the second alignment mark is provided, and aligning the second alignment mark with a bending reference point using the alignment image of the second alignment mark.

According to one or more of the exemplary embodiments, the flexible display apparatus includes alignment marks of a stacked structure of respective portions of a plurality of metal layers fabricated from a plurality of metal layers used in manufacturing processes of the thin film transistor and the touch sensor. In the module-assembling processes of the flexible display apparatus, a clear alignment mark image may be obtained by the alignment mark having a structure in which a plurality of metal layers is stacked. Therefore, an accuracy of the module-assembling processes may be improved.

BRIEF DESCRIPTION OF THE DRAWINGS

The above and other features and advantages of the invention will become more apparent by describing in detailed exemplary embodiments thereof with reference to the accompanying drawings, in which:

FIGS. 6A and 6B are respectively embodiments of a front plan view and a back plan view of a flexible display apparatus;

DETAILED DESCRIPTION

Figure 1:
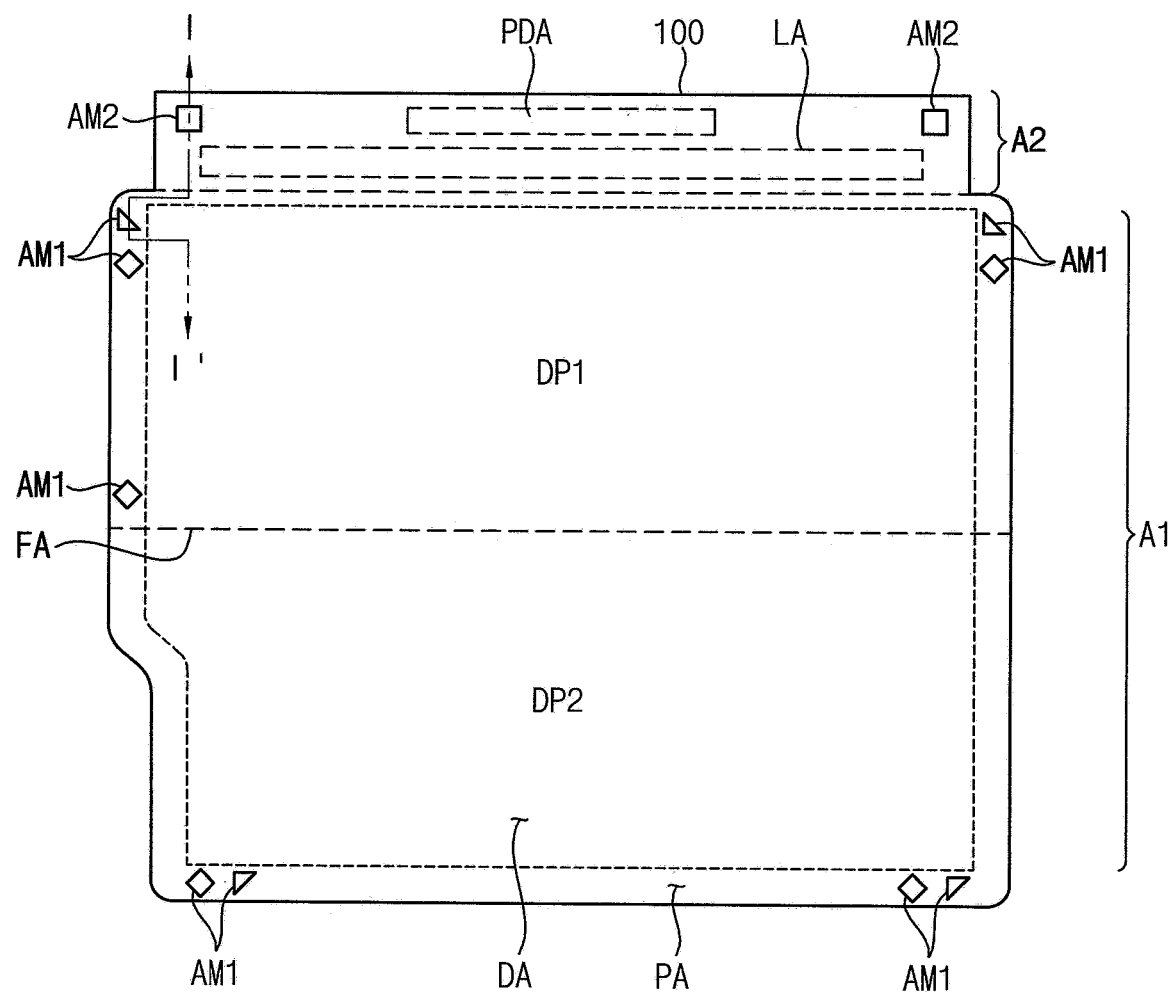
FIG. 1 is a top plan view illustrating an exemplary embodiment of a flexible display panel.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

Figure 2:
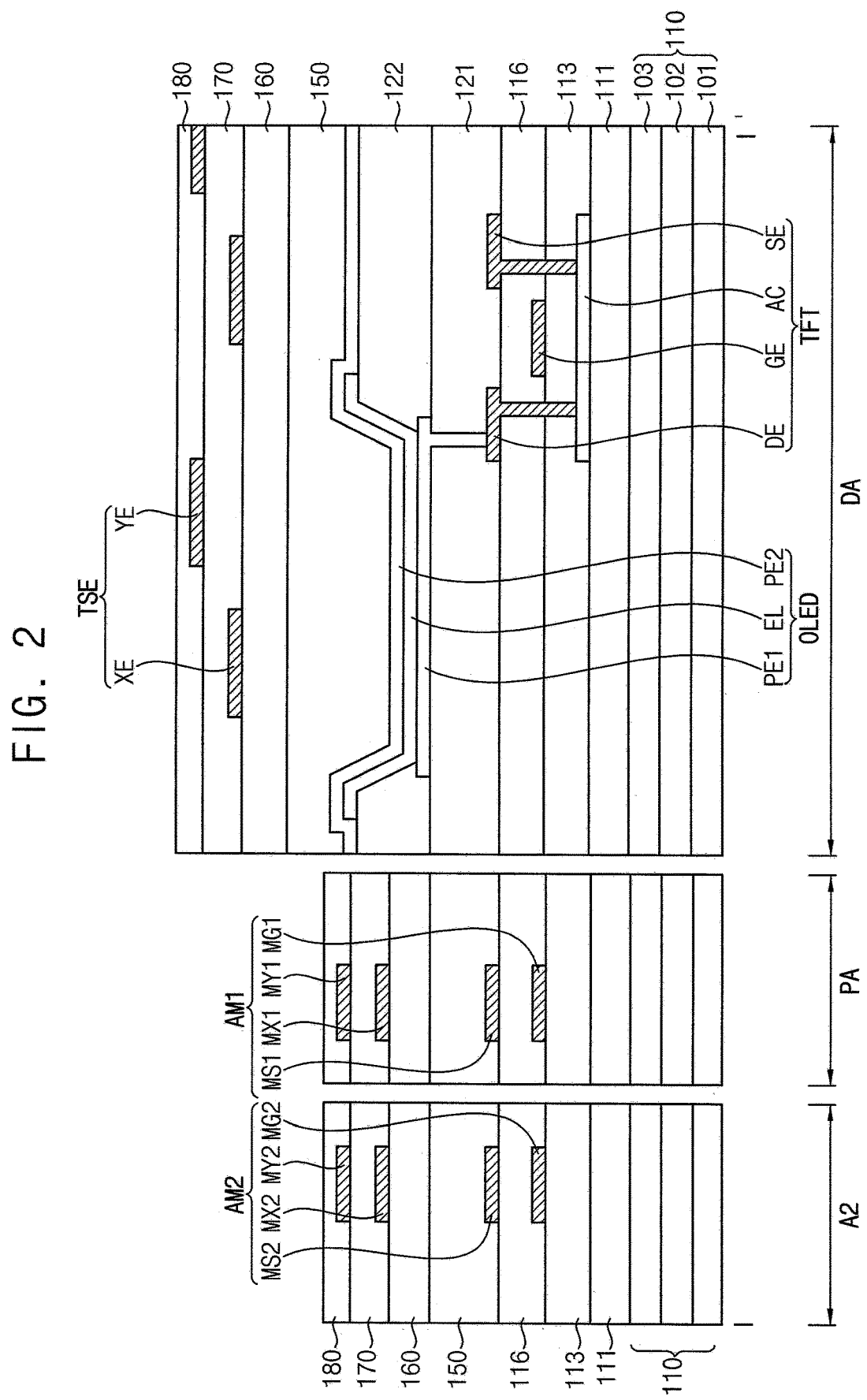
FIG. 2 is a cross-sectional view illustrating the flexible display panel taken along line I-I' in FIG. 1.

FIG. 1 is a top plan view illustrating an exemplary embodiment of a flexible display panel. FIG. 2 is a cross-sectional view illustrating the flexible display panel taken along line I-I' in FIG. 1.

Referring to FIG. 1, the flexible display panel 100 may include a first area A1 and a second area A2 which is adjacent to the first area A1.

The first area A1 may include a display area DA and a peripheral area PA which is adjacent to the display area DA.

The display area DA may include a folding axis FA defined in a central area thereof, and the display area DA may be foldable along the folding axis FA. The flexible display panel 100 and/or components thereof may also be foldable or bendable about the folding axis FA. Therefore, a first display area DP1 and a second display area DP2 of the display area DA may be respectively defined at opposing sides of the folding axis FA.

The display area DA is an area at which an image is displayed. A plurality of signal lines and a plurality of pixels which are connected to corresponding ones of the plurality of signal lines may be arranged in the display area DA.

The peripheral area PA is an area which is adjacent to an edge portion of the display area DA. The peripheral area PA is an area at which an image is not displayed. The peripheral area PA may define an outermost region of the flexible display panel 100. A driver circuit (not shown) for generating signals which are provided to and transmitted through the plurality of signal lines arranged in the display area DA, may be disposed in the peripheral area PA. That is, a driving display signal, a control display signal, etc. may be provided from the outside the display area DA by the driver circuit, and to the pixels in the display area DA via the signal lines.

In one exemplary embodiment, a first alignment mark AM1 provided in plural (also hereinafter, referred to as a plurality of first alignment marks AM1 or first alignment marks AM1) and used in a module-assembling process of the flexible display panel 100, may be disposed in the peripheral area PA. The plurality of first alignment marks AM1 may be used for a bonding alignment and a bonding accuracy test between the flexible display panel 100 and various members of a flexible display apparatus during the module-assembling process. The members of the flexible display apparatus which may be attached to the flexible display panel 100 include film members of the flexible display apparatus.

The plurality of first alignment marks AM1 may have various shapes and may be disposed at various positions within the peripheral area PA. As shown in FIG. 1, each one of the first alignment marks AM1 within a group of first alignment marks AM1 may have a discrete shape in the top plan view. Within a group, the plurality of first alignment marks AM1 may be spaced apart from each other.

The second area A2 may be an extension area which extends from a first side portion of the peripheral area PA. The second area A2 may be considered a portion of the peripheral area PA, without being limited thereto. The second area A2 may include a line area LA and a pad area PDA. The second area A2 together with the peripheral area PA may define a non-display area of the flexible display panel 100.

The line area LA may include arranged therein a plurality of fan-out signal lines connected to signal lines arranged in the display area DA.

The pad area PDA may include arranged therein a plurality of pads connected to the fan-out signal lines. That is, signals such as a driving signal, a control signal, etc. may be provided to the pads in the pad area PDA from outside the flexible display panel 100. In an exemplary embodiment, the signals may be provided from the pads in the pad area PDA, through the fan-out signal lines in the line area LA, and to the signal lines arranged in the display area DA. Pixels in the display area DA may be controlled or driven to display an image with the signals provided from the fan-out signal lines in the line area LA.

In one exemplary embodiment, a second alignment mark AM2 provided in plurality (hereinafter, referred to as a plurality of second alignment marks AM2 or second alignment marks AM2) and used in the module-assembling process of the flexible display panel 100, may be disposed in the second area A2.

The plurality of second alignment marks AM2 are used as a reference point with which a device external to the flexible display panel 100 (hereinafter, referred to as an external device) is coupled to a pad area PDA of the flexible display panel 100. In addition, the plurality of second alignment marks AM2 may be used as the reference point with which a position of the external device coupled to the flexible display panel 100 is indicated in determining if such position is correct.

In an exemplary embodiment of a bending process during a module-assembling process, the second area A2 of the flexible display panel 100 is bent toward a back surface of the first area A1. The plurality of second alignment marks AM2 may be used as a reference point with which a bending alignment and a bending accuracy in bending the second area A2 are determined.

The plurality of second alignment marks AM2 may have various shapes and may be disposed at various positions within the second area A2. Each one of the second alignment marks AM2 may have a discrete shape in the top plan view. In an exemplary embodiment, for example, the plurality of second alignment marks AM2 may be each disposed at an edge portion of the second area A2.

According to one exemplary embodiment, each one alignment mark among the plurality of first alignment marks AM1 and the plurality of second alignment marks AM2 may include at least two metal layers each including a metal material.

Referring to FIG. 2, the flexible display panel 100 may include a colored flexible substrate 110 including the display area DA, the peripheral area PA, and the second area A2.

The colored flexible substrate 110 may include a first transparent layer 101, a colored layer 102 and a second transparent layer 103 which are sequentially stacked. The colored layer 102 may include an opaque material filled therein. Each of the first transparent layer 101, the colored layer 102 and the second transparent layer 103 may include a plastic layer including a plastic material. In an exemplary embodiment, for example, the plastic layer may include or be formed of a material selected from among polyimide ("PI"), polyethylene naphthalate ("PEN"), polyethylene terephthalate ("PET"), polyarylate ("PAR"), polycarbonate ("PC"), polyetherimide ("PEI"), polyethersulfone ("PS"), and the like. The first transparent layer 101, the colored layer 102 and the second transparent layer 103 including the plastic layer may hereinafter be referred to as a first transparent plastic layer 101, a colored plastic layer 102 and a second transparent plastic layer 103, respectively.

The flexible display panel 100 may include a thin film transistor TFT, an organic light emitting diode OLED as a light-emitting element, a touch sensor electrode TSE, a first alignment mark AM1 and a second alignment mark AM2.

The touch sensor electrode TSE may include a first touch electrode XE and a second touch electrode YE. Each one of the aforementioned elements may be provided in plural within the flexible display panel 100.

The flexible display panel 100 may include a buffer layer 111, a gate insulating layer 113, a first interlayer insulating layer 116, a first planarization layer 121, a pixel definition layer 122, an encapsulation member 150, a second planarization layer 160, a second interlayer insulating layer 170, and a passivation layer 180.

The thin film transistor TFT includes an active pattern AC, a gate electrode GE, a source electrode SE, and a drain electrode DE. The gate electrode GE may include or be formed from a first metal layer, and the source electrode SE and the drain electrode DE may be formed from a second metal layer. The source electrode SE and the drain electrode DE may be formed from a same one second metal layer to be disposed in a same layer of the flexible display panel 100 among layers disposed on the colored flexible substrate 110.

The organic light emitting diode OLED may include a first pixel electrode PE1, a light emitting layer EL, and a second pixel electrode PE2. The first pixel election PE1 is connected to the drain electrode DE of the thin film transistor TFT at or through a contact hole in the first planarization layer 121. The light emitting layer EL is disposed on the first pixel electrode PE1 exposed through an opening in the pixel definition layer 122. The second pixel electrode PE2 is disposed on the light emitting layer EL and overlaps with the first pixel electrode PE1.

The encapsulation member 150 may cover a front surface of the display area DA and extend from the display area DA to cover both the peripheral area PA and the second area A2. However, in an alternative exemplary embodiment, the encapsulation member 150 may not cover the pad area PDA in the second area A2.

The first touch electrode XE may be provided or formed in the display area DA. The first touch electrode XE may be a first electrode of a touch sensor for sensing a touch from outside the flexible display panel 100. The first touch electrode XE may include or be formed from a third metal layer.

The second touch electrode YE may be a second electrode of the touch sensor. The second touch electrode YE may include or be formed from a fourth metal layer.

The first alignment mark AM1 may be disposed in the peripheral area PA. The first alignment mark AM1 includes a first layer MG1 formed from a same first metal layer as the gate electrode GE, a second layer MS1 formed from a same second metal layer as the source electrode SE, a third layer MX1 formed from a same third metal layer as the first touch electrode XE and a fourth layer MY1 formed from a same fourth metal layer as the second touch electrode XY. That is, the various layers of the first alignment mark AM1 and the corresponding electrodes described above, are respectively portions of a same material layer, so as to be disposed in a same layer of the flexible display panel 100 among layers provided on the colored flexible substrate 110.

In one exemplary embodiment, the first alignment mark AM1 may have a structure in which at least two portions among the first through fourth metal layers are stacked.

The second alignment mark AM2 may be disposed in the second area A2. The second alignment mark AM2 includes a first layer MG2 formed from a same first metal layer as the gate electrode GE, a second layer MS2 formed from a same second metal layer as the source electrode SE, a third layer MX2 formed from a same third metal layer as the first touch electrode XE and a fourth layer MY2 formed from a same fourth metal layer as the second touch electrode XY. That is, the various layers of the second alignment mark AM2 and the corresponding electrodes described above, are respectively portions of a same material layer, so as to be disposed in a same layer of the flexible display panel 100 among layers provided on the colored flexible substrate 110.

In one exemplary embodiment, the second alignment mark AM2 may have a multi-layer structure in which at least two portions among the first to fourth metal layers are stacked.

Figure 3:
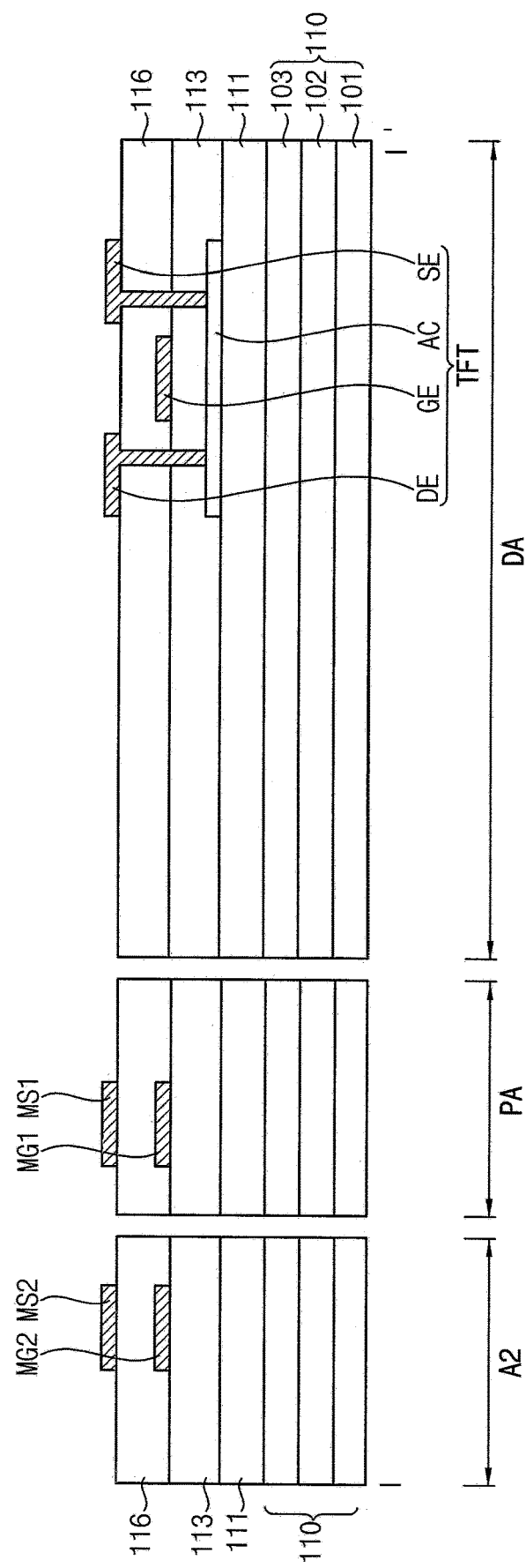
FIGS. 3 to 5 are cross-sectional views illustrating structures of a flexible display panel in an exemplary embodiment of a method of manufacturing the flexible display panel of FIG. 2.
Figure 4:
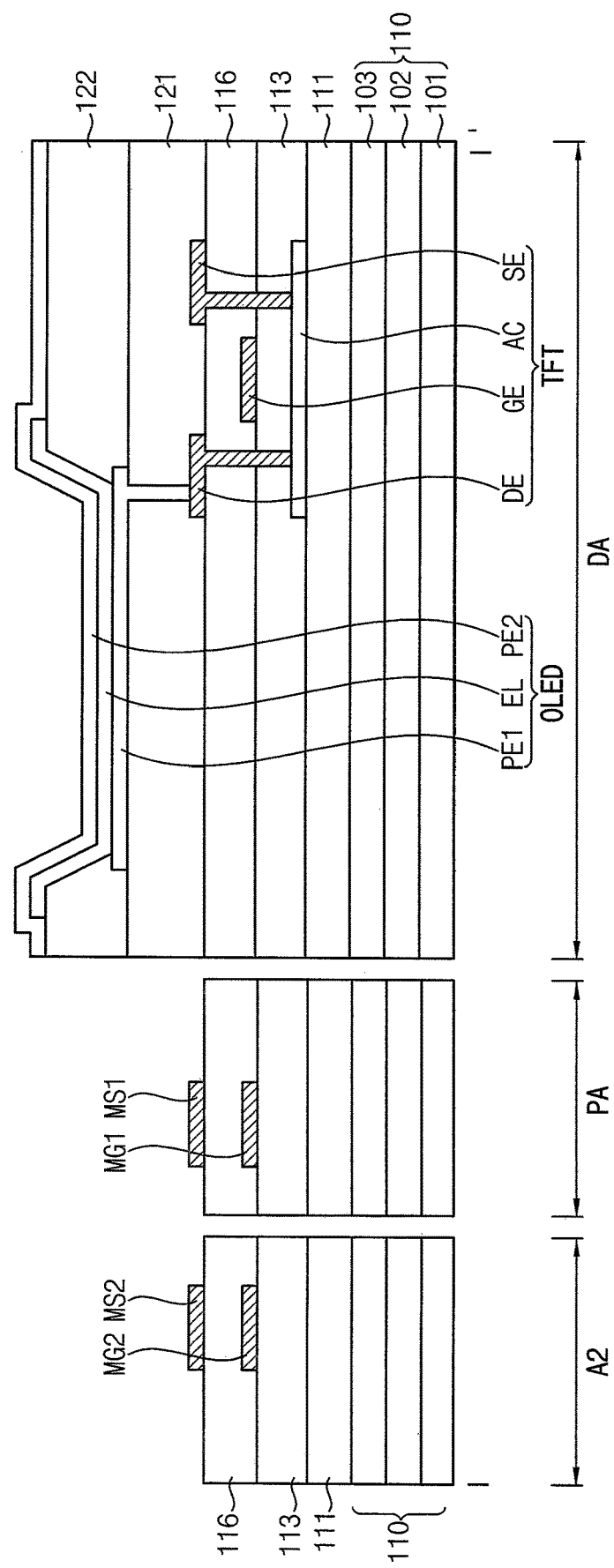
Figure 5:
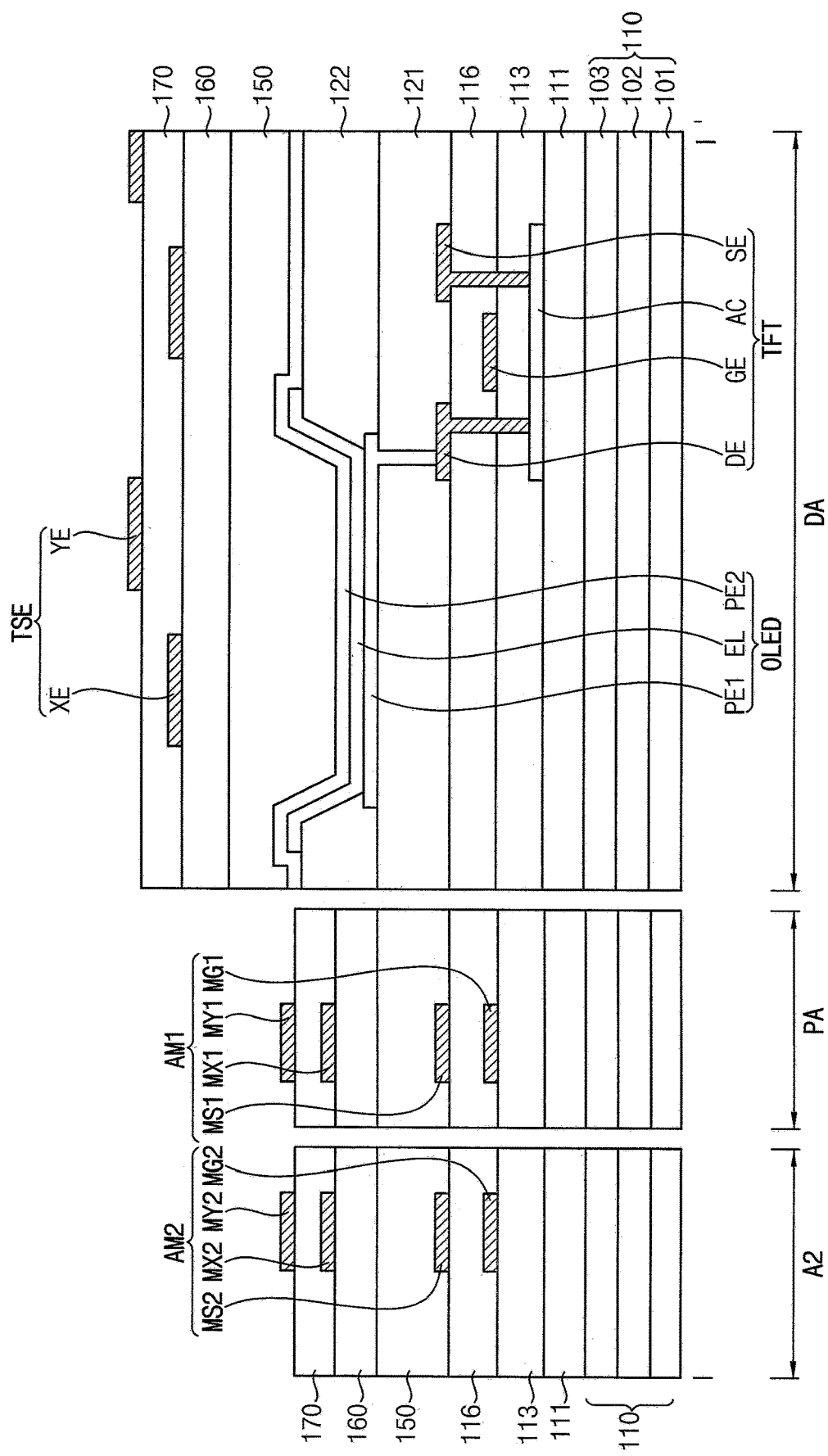

FIGS. 3 to 5 are cross-sectional views illustrating structures of a flexible display panel in an exemplary embodiment of a method of manufacturing the flexible display panel of FIG. 2.

Referring to FIG. 3, the colored flexible substrate 110 may include a first transparent plastic layer 101, a colored plastic layer 102 and a second transparent plastic layer 103 which are sequentially stacked.

A buffer layer 111 is provided or formed on the colored flexible substrate 110. In an exemplary embodiment, for example, the buffer layer 111 may be provided or formed by various methods such as a chemical vapor deposition ("CVD") or a sputtering using silicon oxide, silicon nitride, silicon oxynitride, or the like.

A thin film transistor TFT, the first layer MG1 and the second layer MS1 of a first alignment mark AM1 and the first layer MG2 and the second layer MS2 of a second alignment mark AM2 are provided or formed on the buffer layer 111.

The thin film transistor TFT may include an active pattern AC, a gate electrode GE, a source electrode SE, and a drain electrode DE.

A semiconductor layer may be provided or formed on the buffer layer 111. In an exemplary embodiment, for example, a semiconductor layer may be provided or formed by providing or forming a layer including a silicon-containing material, an oxide semiconductor material or the like, on an entire surface of the buffer layer 111, and then patterned the layer to form a semiconductor layer. When a semiconductor layer is provided or formed using the silicon-containing material, an amorphous silicon layer may be provided or formed on the entire surface of the buffer layer 111 and crystallized to form a polycrystalline silicon layer. The semiconductor layer is patterned to form an active pattern AC. Each of opposing sides of the active pattern AC may be doped with impurities to form the active pattern AC including a source area, a drain area, and a channel area which is between the source and drain areas.

A gate insulating layer 113 may be provided or formed on the active pattern AC. In an exemplary embodiment, for example, the gate insulating layer 113 may be provided or formed using silicon oxide, silicon nitride, silicon oxynitride, or the like.

A first metal layer is provided or formed on the gate insulating layer 113 and patterned to provide or form a gate electrode GE, a first layer MG1 of the first alignment mark AM1 and a first layer MG2 of the second alignment mark AM2.

A first interlayer insulating layer 116 may be provided or formed on the gate electrode GE, the first layer MG1 and the first layer MG2. In an exemplary embodiment, for example, the first interlayer insulating layer 116 may include or be formed of silicon oxide, silicon nitride, silicon oxynitride, or the like.

A plurality of contact holes exposing the semiconductor layer may be provided or formed in the first interlayer insulating layer 116 and the gate insulating layer 113. In an exemplary embodiment, for example, the contact holes may respectively expose a source area and a drain area of the active pattern AC.

A second metal layer is provided or formed on the first interlayer insulating layer 116. The second metal layer is patterned to form a source electrode SE connected to the source area, a drain electrode DE connected to the drain area, a second layer MS1 of the first alignment mark AM1 and a second layer MS2 of the second alignment mark AM2.

Referring to FIG. 4, a first planarization layer 121 is provided or formed on the source electrode SE and the drain electrode DE. The first planarization layer 121 may include an organic material such as an acrylic resin, an epoxy resin, a polyimide resin, and a polyester resin. The first planarization layer 121 may be provided or formed only in the display area DA.

A first pixel electrode PE1 is provided or formed on the first planarization layer 121. The first pixel electrode PE1 may be connected to the drain electrode DE of the thin film transistor TFT through a contact hole provided or formed in the first planarization layer 121.

A pixel definition layer 122 is provided or formed on the first pixel electrode PE1. The pixel definition layer 122 may be provided or formed only in the display area DA. In an exemplary embodiment, for example, the pixel definition layer 122 may include or be formed of a polyimide resin, a photoresist, an acryl resin, a polyamide resin, a siloxane resin, or the like. The pixel definition layer 122 may be patterned to provide or form an opening exposing a portion of the first pixel electrode PE1.

A light emitting layer EL is provided or formed on the first pixel electrode PE1 in the opening. The light emitting layer EL may include a hole injection layer ("HIL"), a hole transport layer ("HTL"), an electron transport layer ("ETL"), an organic light emitting layer ("EML"), and an electron injection layer ("EIL").

A second pixel electrode PE2 is provided or formed on light emitting layer EL. The second pixel electrode PE2 may be provided or formed entirely in the display area DA.

Referring to FIG. 5, an encapsulation member 150 is provided or formed on the second layer MS1, the second layer MS2 and the organic light emitting diode OLED. The encapsulation member 150 may have a structure in which an inorganic layer and an organic layer are alternately stacked. The encapsulation member 150 may protect the organic light emitting diode OLED from moisture. The encapsulation member 150 may be provided or formed in the peripheral area PA and the second area A2. Alternatively, the encapsulation member 150 may not be provided or formed in the peripheral area PA or the second area A2.

A second planarization layer 160 is provided or formed on the encapsulation member 150. The second planarization layer 160 may be provided or formed entirely in the display area DA, the peripheral area PA, and the second area A2.

A third metal layer is provided or formed on the second planarization layer 160. The third metal layer is patterned to form a first touch electrode XE, a third layer MX1 of a first alignment mark AM1, and a third layer MX2 of a second alignment mark AM2.

A second interlayer insulating layer 170 is provided or formed on the first touch electrode XE, the third layer MX1 and the third layer MX2.

A fourth metal layer is provided or formed on the second interlayer insulating layer 170. The fourth metal layer may be patterned to provide or form a second touch electrode YE, a fourth layer MY1 of a first alignment mark AM1 and a fourth layer MY2 of a second alignment mark AM2.

A passivation layer 180 is provided or formed on the second touch electrode YE, the fourth layer MY1 and the fourth layer MY2. The passivation layer 180 may be provided or formed entirely in the display area DA, the peripheral area PA, and the second area A2 of the colored flexible substrate 110.

The flexible display panel 100 according to the exemplary embodiment may be completed by the above manufacturing processes.

The flexible display panel 100 according to the exemplary embodiment may include the first alignment mark AM1 and the second alignment mark AM2 in each of which at least portions of two metal layers are stacked.

Figure 6B:
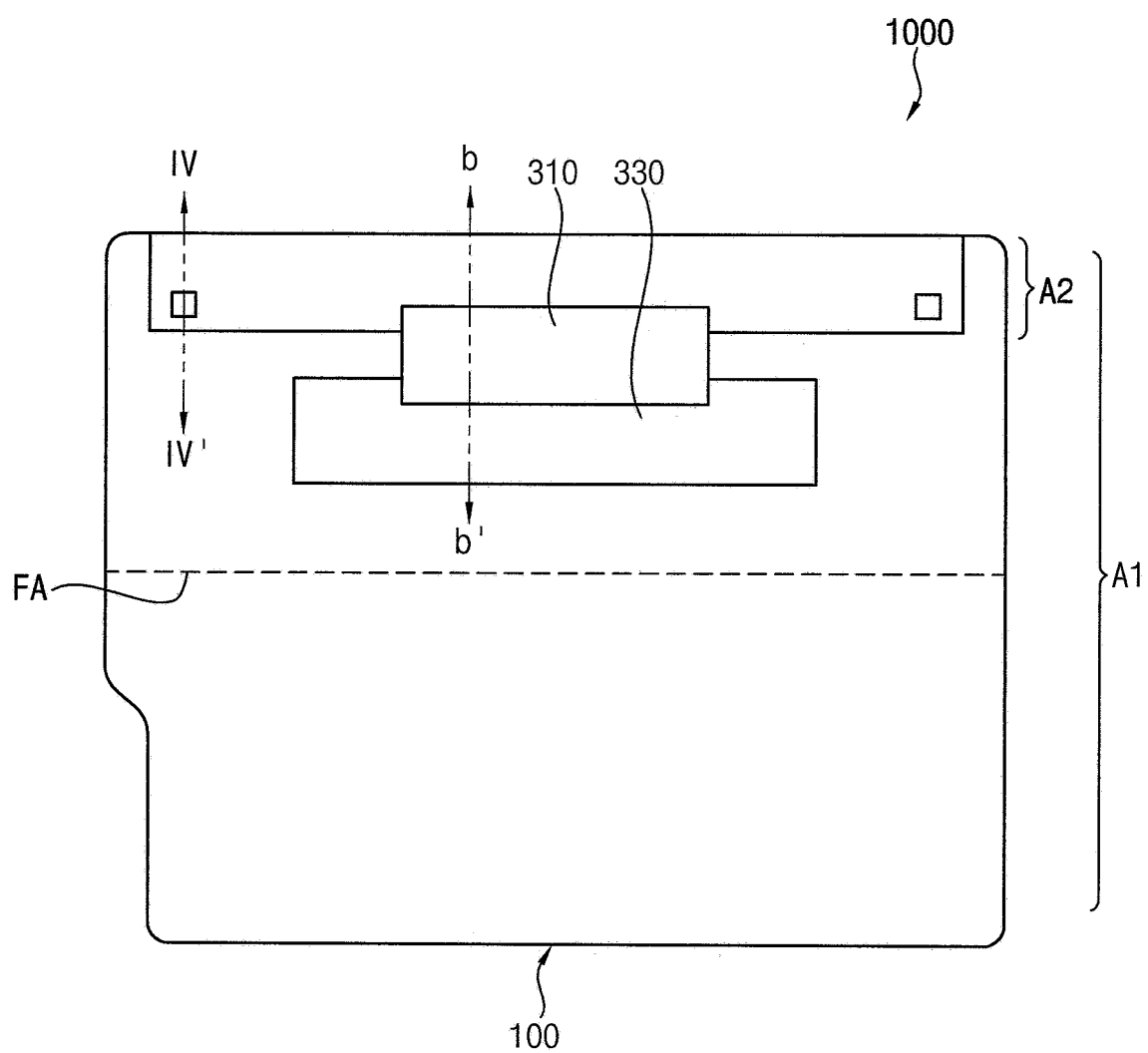
Figure 7A:
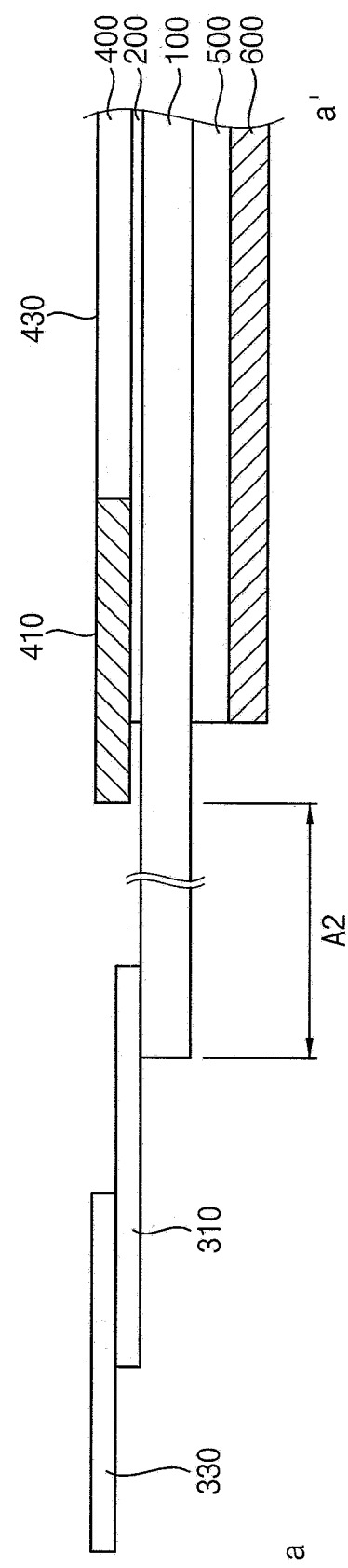
FIG. 7A is a cross-sectional view illustrating the flexible display apparatus taken along line a-a' in FIG. 6A.
Figure 7B:
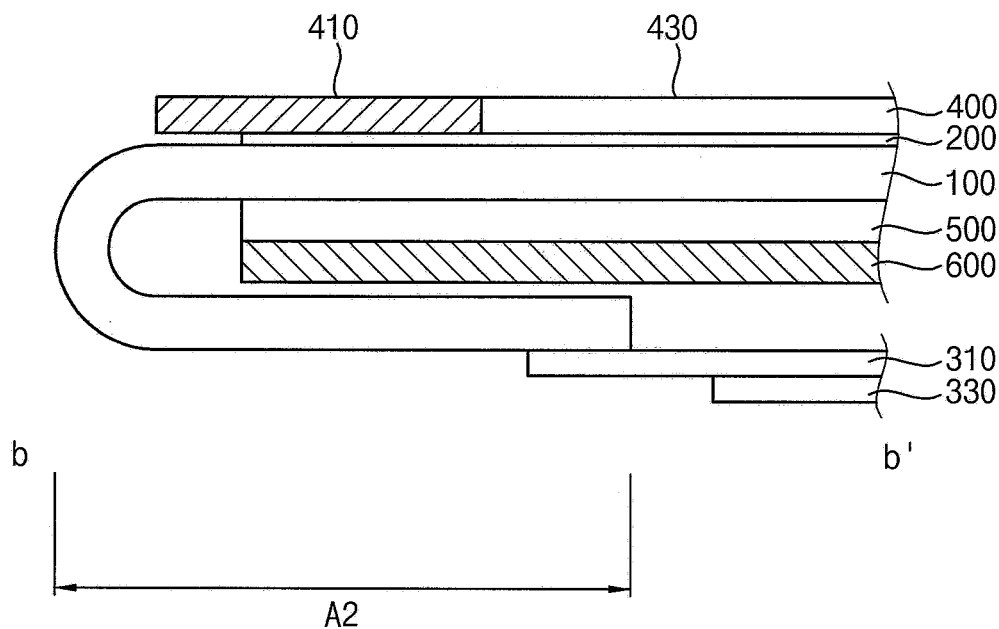
FIG. 7B is a cross-sectional view illustrating the flexible display apparatus taken along line b-b' in FIG. 6B.

FIGS. 6A and 6B are respectively embodiments of a front plan view and a back plan view of a flexible display apparatus. FIG. 7A is a cross-sectional view illustrating the flexible display apparatus taken along line a-a' in FIG. 6A. FIG. 7B is a cross-sectional view illustrating the flexible display apparatus taken along line b-b' in FIG. 6B.

Referring to FIGS. 6A to 7B, the flexible display apparatus 1000 may include a flexible display panel 100, a polarizing member 200, a circuit mounting film 310, a flexible circuit board 330, a window member 400, a protective film 500 and a metal plate 600. The flexible display apparatus 1000 and/or components thereof may be disposed in a plane defined by a first direction and a second direction which cross each other. In FIGS. 6A and 6B, for example, the horizontal direction and the vertical direction may variously represent the first direction and/or the second direction. A thickness of the flexible display apparatus 1000 and/or components thereof may be defined along a third direction which crosses each of the first direction and the second direction. In FIGS. 7A and 7B, for example, the vertical direction may represent a thickness direction, while the horizontal direction may variously represent the first direction and/or the second direction.

The flexible display panel 100 may include substantially the same components as those of the flexible display panel according to the previous embodiments described with reference to FIGS. 1 and 2.

The flexible display panel 100 may include a first area A1 and a second area A2.

The first area A1 may include a display area DA and a peripheral area PA which is adjacent to the display area DA. The peripheral area PA may surround the display area DA in a top plan view, without being limited thereto.

The display area DA includes a folding axis FA defined at a central area of the display area DA, and a first display area DP1 and a second display area DP2 may be defined respectively on opposing sides of the folding axis FA. The display area DA is an area at which an image is displayed, and in which a plurality of signal lines and a plurality of pixels may be arranged.

The peripheral area PA is an area adjacent to an edge portion of the display area DA. A driver circuit (not shown) for generating signals which are provided to the plurality of signal lines arranged in the display area DA, may be disposed in peripheral area PA.

In one exemplary embodiment, a plurality of first alignment marks AM1 used in a module-assembling process of the flexible display panel 100 may be disposed in the peripheral area PA. The plurality of first alignment marks AM1 may be used for a bonding alignment and a bonding accuracy test between the flexible display panel 100 and various attachment members of the flexible display apparatus 1000, such as film members of the flexible display apparatus 1000, during the module-assembling process.

The plurality of first alignment marks AM1 may have various shapes and may be disposed at various positions within the peripheral area PA.

The second area A2 may be an extension area of the flexible display panel 100 which extends from a first side portion of the peripheral area PA. The second area A2 may include a pad area PDA. The pad area PDA may include a plurality of pads, and the plurality of pads may be connected to the circuit mounting film 310.

In one exemplary embodiment, a plurality of second alignment marks AM2 used in the module assembling process of the flexible display panel 100 may be disposed in the second area A2.

The plurality of second alignment marks AM2 are used as a reference point for accurately coupling an external device to a pad area PDA of the flexible display panel 100. In addition, the plurality of second alignment marks AM2 may be used as the reference point for checking whether the external device is coupled to the flexible display panel 100 at a correct position.

Referring to FIGS. 6A and 6B, the flexible display panel 100 having the circuit mounting film 310 and the flexible circuit board 330 coupled thereto is bendable at the second area A2. The flexible display panel 100 may be bendable at a boundary between the first area A1 and the second area A2, without being limited thereto. In an exemplary embodiment of a bending process of a module-assembling process, the flexible display panel 100 which is bent disposes the second area A2 facing the back surface of the first area A1. The plurality of second alignment marks AM2 may be used to check a bending alignment and a bending accuracy related to a position of the second area A2 relative to the first area A1.

The plurality of second alignment marks AM2 may have various shapes and may be disposed at various positions within the second area A2. In an exemplary embodiment, for example, the plurality of second alignment marks AM2 may be disposed at an edge portion of the second area A2.

The plurality of first alignment marks AM1 and the plurality of second alignment marks AM2 may each have a structure in which portions of at least two metal layers are stacked along a thickness direction of the flexible display panel 100, as described with reference to FIG. 2.

Referring to FIG. 7A, the polarizing member 200 is disposed on a first surface of the flexible display panel 100. The first surface may correspond to a front surface of the flexible display panel 100 as a light emitting surface thereof. The polarizing member 200 may be attached to the first surface of the flexible display panel 100 using an adhesive film member.

The circuit mounting film 310 may include a first end portion mounted on and/or connected to the plurality of pads formed in the second area A2 of the flexible display panel 100, and a second end portion which is opposite to the first end portion and connected to the flexible circuit board 330.

The flexible circuit board 330 may be connected at a second end thereof to the second end portion of the circuit mounting film 310, and the flexible circuit board 300 may be connected at a first end thereof to an external graphics device (not shown).

The window member 400 is disposed on the first surface of the polarizing member 200. The window member 400 is a film material and may be attached to the polarizing member 200 using an adhesive film member. The window member 400 includes a light shielding part 410 for blocking a light generated from the flexible display panel 100 and a transmission window 430 for transmitting the light. The light shielding part 410 may correspond to the peripheral area PA of the flexible display panel 100. The transmission window 430 may correspond to the display area DA of the flexible display panel 100.

Referring to FIGS. 7A and 7B, the protective film 500 is disposed on a second surface of the flexible display panel 100 which is opposite to the first surface of the flexible display panel 100. The second surface may correspond to a back surface which is opposite to the front surface of the flexible display panel 100. The protective film 500 may protect the flexible display panel 100 from external impacts by including a cushioning material. The protective film 500 may be attached to the second surface of the flexible display panel 100 by an adhesive film member.

The metal plate 600 is disposed on the protective film 500 disposed on the second surface of the flexible display panel 100. The metal plate 600 may serve as a frame to maintain a rigidity or an overall shape of the flexible display panel 100. The metal plate 600 may be attached to the protective film 500 by an adhesive film member.

Referring to FIGS. 6B and 7B, the metal plate 600 may include a first surface attached to the protective film 500 and a second surface opposite to the first surface. Referring to FIG. 7A, the flexible display panel 100 which is not bent disposes the second surface of the metal plate 600 exposed outside the flexible display apparatus 1000. The flexible display panel 100 which is bent disposes the second area A2 thereof facing the second surface of the metal plate 600. The flexible display panel 100 which is bent also disposes the second area A2 thereof facing the first area A1, as shown in FIGS. 6B and 7B. The circuit mounting film 310 and the flexible circuit board 330 which are connected to the second area A2 of the flexible display panel 100 may be disposed facing the second surface of the metal plate 600.

FIGS. 8 to 12 are cross-sectional views illustrating structures of a flexible display apparatus in an exemplary embodiment of a method of module-assembling a flexible display apparatus.

Figure 8:
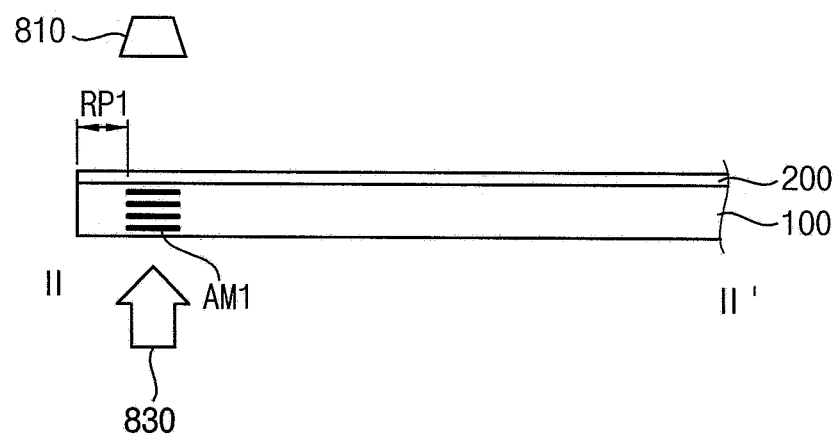
FIGS. 8 to 12 are cross-sectional views illustrating structures of a flexible display apparatus in an exemplary embodiment of a method of module-assembling the flexible display apparatus of FIGS. 6A and 6B.

FIG. 8 is a cross-sectional view illustrating the flexible display apparatus taken along line II-II' in FIG. 6A, according to a first assembling process.

Referring to FIG. 8, the module-assembling process may include using a camera 810 and a lamp 830. The camera 810 generates an alignment image using a light generated from the lamp 830. The lamp 830 irradiates an area of the flexible display panel 100 in which an alignment mark is disposed to identify and determine a location of the alignment mark disposed on the flexible display panel 100. The light from the lamp 830 may be incident to the area of the flexible display panel 100 in which an alignment mark is disposed and subsequently transmitted or reflected based on interaction of the light relative to the alignment mark and surrounding area of the flexible display panel 100.

In the first assembling process, the polarizing member 200 may be aligned and attached on the flexible display panel 100 using a first alignment mark AM1 disposed in the flexible display panel 100. The portions of various metal layers within the first alignment mark AM1 are shown as solid line bars in FIG. 8.

The camera 810 may be disposed on the flexible display panel 100 and the lamp 830 may be disposed on a lower portion of the flexible display panel 100. In this case, the camera 810 may generate a first alignment image using the light of the lamp 830 transmitted through the flexible display panel 100.

In one exemplary embodiment, a substrate of the flexible display panel 100 may be flexible and may include a plastic layer which is colored. When the lamp 830 is disposed at the lower portion of the flexible display panel 100, the light may be reflected by a material included in and filling the plastic layer which is colored. Therefore, the light incident on the camera 810 decreases, and thus a sharpness of the alignment image may be degraded.

However, according to one or more exemplary embodiment, the first alignment mark AM1 has a structure in which a plurality of metal layers is stacked, so that a sharpness of the alignment image corresponding to the first alignment mark AM1 may be increased. Light may be reflected by the first alignment mark AM1, to increase sharpness of the alignment image.

Alternatively, although not shown in figures, the lamp 830 may be disposed at an upper portion of the flexible display panel 100, such as corresponding to the camera 810. In this case, the camera 810 may generate a first alignment image using the light reflected from the flexible display panel 100.

In one exemplary embodiment, the first alignment mark AM1 has a structure in which portions of a plurality of metal layers are stacked, so that the sharpness of the alignment image is increased by generation of reflected light by the metal layers.

The first alignment mark AM1 and a first reference point RP1 of the polarizing member 200 are aligned to be adjacent to each other, using the first alignment image generated by the camera 810. While the first reference point RP1 of the polarizing member 200 is aligned with the first alignment mark AM1, the polarizing member 200 may be coupled to the flexible display panel 100. The first reference point RP1 of the polarizing member 200 may be defined at a location along the polarizing member 200. The first reference point RP1 of the polarizing member 200 may be an edge area of the polarizing member 200.

In one exemplary embodiment, the polarizing member 200 is attached on the first surface of the flexible display panel 100, and then a process of attaching the circuit mounting film 310 and the flexible circuit board 330 may be performed.

Referring to FIG. 6A, in an assembling process of the circuit mounting film 310, the circuit mounting film 310 is aligned and attached to the pad area PDA of the flexible display panel 100 using the second alignment mark AM2 disposed in the second area A2 of the flexible display panel 100. The circuit mounting film 310 may be aligned and attached to the pad area PDA of the flexible display panel 100 by using the second alignment mark AM2 and a reference point (not shown) of the circuit mounting film 310.

The camera 810 may generate an alignment mark image using transmitted light or reflected light according to a position of the lamp 830.

In one exemplary embodiment, the second alignment mark AM2 has a structure in which portions of a plurality of metal layers are stacked, so that the alignment mark image of the second alignment mark AM2 generated by the transmitted light or the reflected light, may be clearly viewable.

The second alignment mark AM2 and the circuit mounting film 310 are aligned by using the alignment mark image. While the second alignment mark AM2 and the circuit mounting film 310 are aligned with each other, the circuit mounting film 310 is attached to the flexible display panel 100.

The flexible circuit board 330 may be mounted on the circuit mounting film 310 using the second alignment mark AM2 in substantially the same manner as the assembling process of the circuit mounting film 310 described above.

Figure 9:
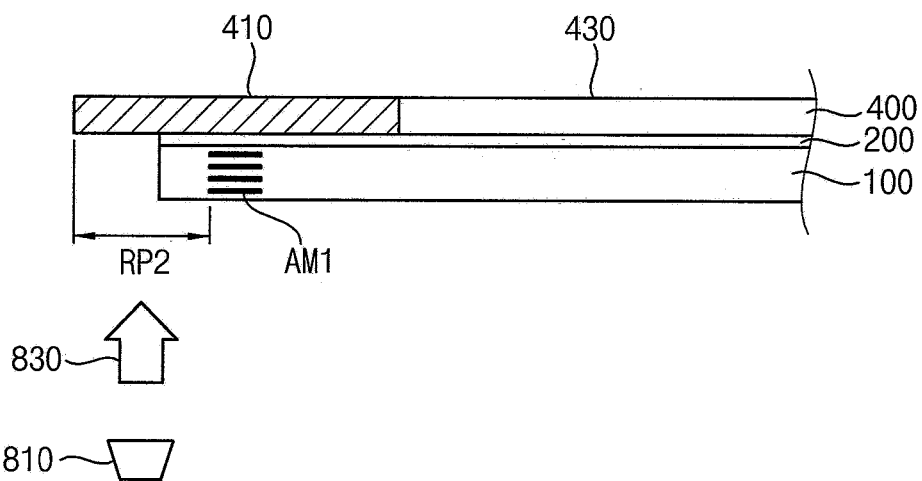

FIG. 9 is a cross-sectional view illustrating the flexible display apparatus taken along line II-II' in FIG. 6A according to a second assembling process.

Referring to FIG. 9, in the second assembling process, a window member 400 is aligned and attached to the polarizing member 200 using a first alignment mark AM1 disposed in the flexible display panel 100. An adhesive film member may be disposed between the polarizing member 200 and the window member 400 to attach the polarizing member 200 and the window member 400 to each other. The first alignment mark AM1 used in the second assembling process may be the same first alignment mark AM1 used in the first assembling process, without being limited thereto.

The camera 810 and the lamp 830 may be disposed under the flexible display panel 100 since the light shielding part 410 of the window member 400 is above the flexible display panel 100.

The camera 810 generates a second alignment image using the reflected light reflected from the first alignment mark AM1 of the flexible display panel 100.

In one exemplary embodiment, the first alignment mark AM1 has a structure in which portions of a plurality of metal layers are stacked, so that a sharpness of the second alignment image generated by the reflected light may be increased.

The first alignment mark AM1 and a second reference point RP2 of the window member 400 are aligned with each other using the second alignment image generated by the camera 810. While the first alignment mark AM1 and the second reference point RP2 of the window member 400 are aligned with each other, the window member 400 may be attached to the flexible display panel 100. The second reference point RP2 of the window member 400 may be defined at a location along the window member 400. The second reference point RP2 of the window member 400 may be at an edge area of the window member 400.

Figure 10:
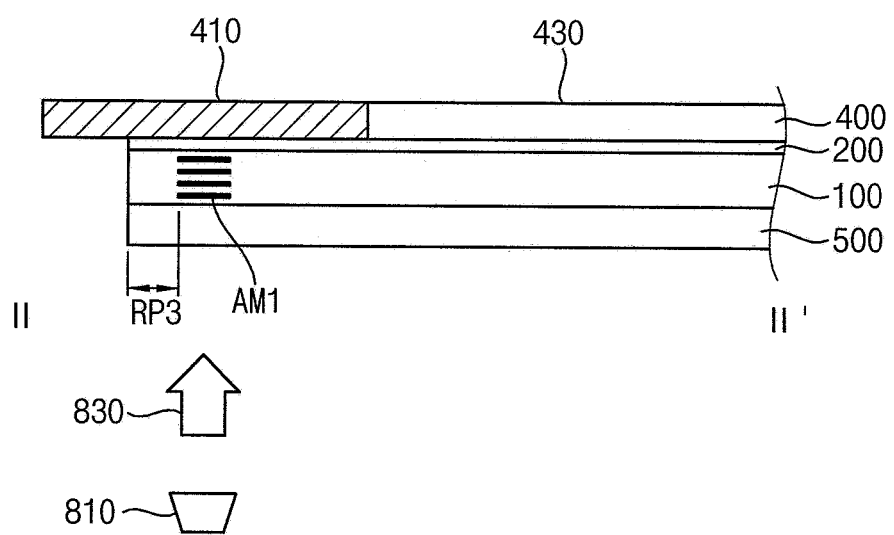

FIG. 10 is a cross-sectional view illustrating the flexible display apparatus taken along line II-II' in FIG. 6A according to a third assembling process.

Referring to FIG. 10, in the third assembling process, the protective film 500 is aligned and attached to the second surface of the flexible display panel 100 using the first alignment mark AM1 disposed in the flexible display panel 100. An adhesive film member may be disposed between the second surface of the flexible display panel 100 and the protective film 500 to attach the flexible display panel 100 and the protective film 500 to each other. The first alignment mark AM1 used in the third assembling process may be the same first alignment mark AM1 used in the second assembling process, without being limited thereto.

The camera 810 and the lamp 830 may be disposed under the flexible display panel 100 due to the light shielding part 410 of the window member 400 above the flexible display panel 100.

In this case, the camera 810 generates a third alignment image using the reflected light reflected from the first alignment mark AM1 of the flexible display panel 100.

In one exemplary embodiment, the first alignment mark AM1 has a structure in which portions of a plurality of metal layers are stacked, such that a sharpness of the third alignment image generated by the reflected light may be increased.

The first alignment mark AM1 and a third reference point RP3 of the protective film 500 are aligned with each other using the third alignment image generated by the camera 810. While the first alignment mark AM1 and the third reference point RP3 of the protective film 500 are aligned with each other, the protective film 500 may be attached to the flexible display panel 100. The third reference point RP3 of the protective film 500 may be defined at a location along the protective film 500. The third reference point RP3 of the protective film 500 may be at an edge area of the protective film 500.

Figure 11:
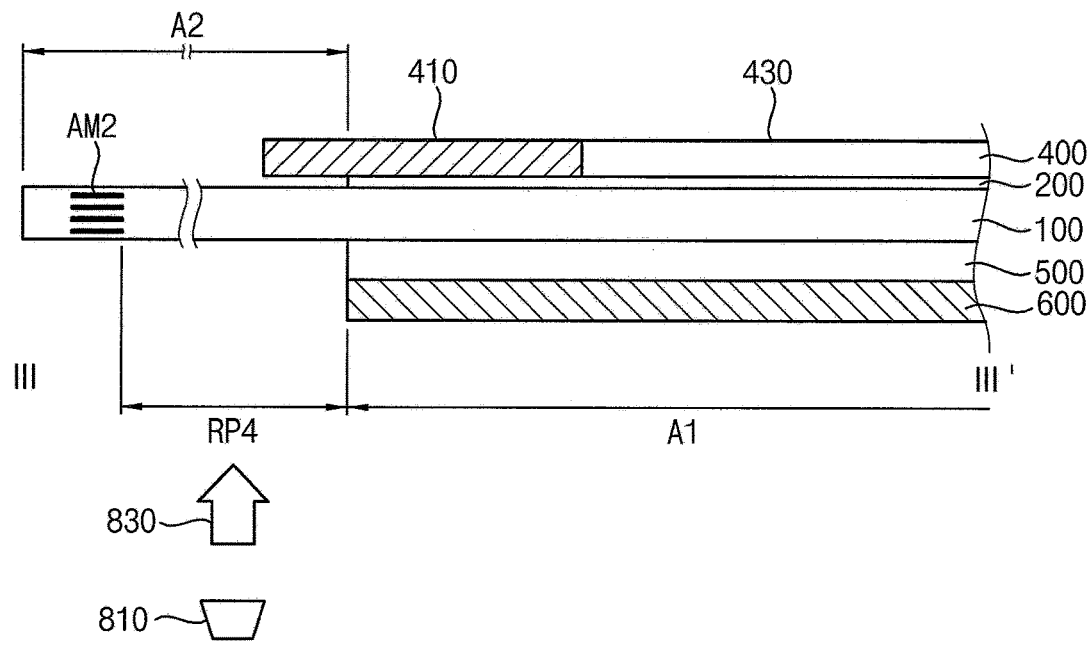

FIG. 11 is a cross-sectional view illustrating the flexible display apparatus taken along line III-III' in FIG. 6A according to a fourth assembling process.

Referring to FIG. 11, in the fourth assembling process, the metal plate 600 is aligned and attached to the protective film 500 using a second alignment mark AM2 disposed in the flexible display panel 100. An adhesive film member may be disposed between the protective film 500 and the metal plate 600 to attach the protective film 500 and the metal plate 600 to each other.

The camera 810 and the lamp 830 may be disposed under the flexible display panel 100 due to the light shielding part 410 and the metal plate 600 of the window member 400 above the flexible display panel 100.

The camera 810 generates a fourth alignment image using the reflected light reflected by the second alignment mark AM2 of the flexible display panel 100. The metal plate 600 is arranged to overlap the first area A1 of the flexible display panel 100, e.g., the display area DA and the peripheral area PA. Thus, the metal plate 600 may be aligned with respect to the stacked structure in FIG. 10 by using the second alignment mark AM2 disposed in the second area A2.

In one exemplary embodiment, the second alignment mark AM2 has a structure in which portions of a plurality of metal layers are stacked, so that a sharpness of the fourth alignment image generated by the reflected light may be increased.

The second alignment mark AM2 and a fourth reference point RP4 of the metal plate 600 are aligned with each other using the fourth alignment image generated by the camera 810. While the second alignment mark AM2 and the fourth reference point RP4 of the metal plate 600 are aligned with each other, the metal plate 600 may be attached to the flexible display panel 100. The fourth reference point RP4 of the metal plate 600 may be defined at a location along the metal plate 600. The fourth reference point RP4 of the metal plate 600 may be at an edge area of the metal plate 600.

Figure 12:
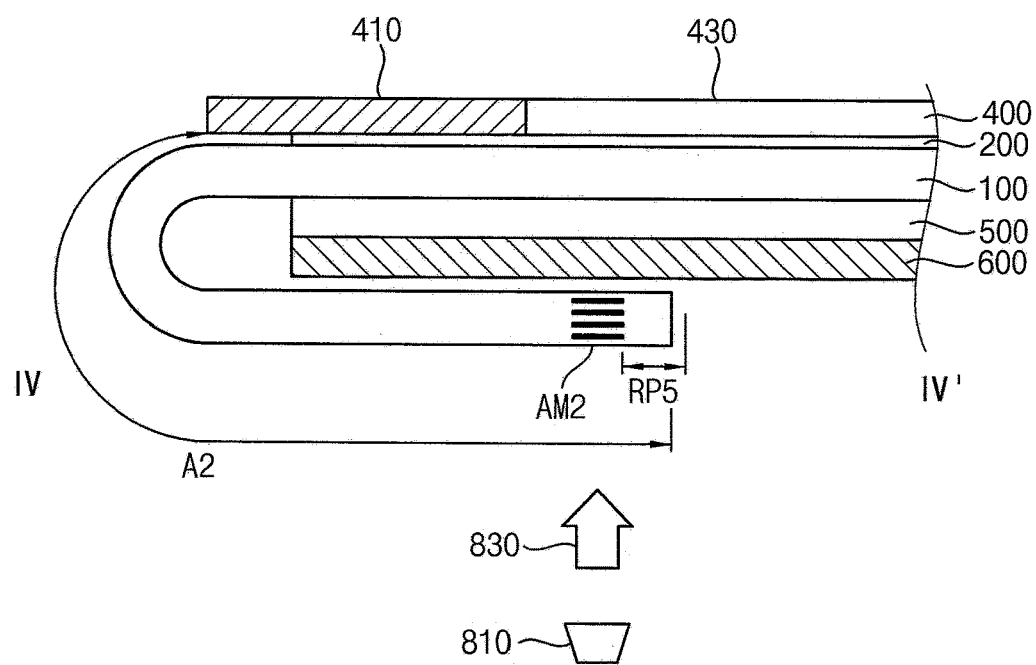

FIG. 12 is a cross-sectional view illustrating the flexible display apparatus taken along line IV-IV' in FIG. 6B according to a fifth assembling process.

Referring to FIG. 12, in a fifth assembling process, the stacked structure in FIG. 11 is bent to dispose the second area A2 of the flexible display panel 100 facing the second surface of the flexible display panel 100.

The metal plate 600 may include a first surface facing and at which the metal plate 600 is attached to the protective film 500, and a second surface opposite the first surface. The flexible display panel 100 may be bent to dispose the second area A2 facing the second surface of the metal plate 600.

The camera 810 and the lamp 830 may be disposed under the flexible display panel 100, at a same side of the stacked structure in FIG. 12 at which the metal plate 600 is disposed.

The camera 810 generates a fifth alignment image using the reflected light reflected by the second alignment mark AM2 of the flexible display panel 100. The second alignment mark AM2 used in the fifth assembling process may be the same second alignment mark AM1 used in the fourth assembling process, without being limited thereto.

In one exemplary embodiment, the second alignment mark AM2 has a structure in which portions of a plurality of metal layers is stacked, so that a sharpness of the fifth alignment image generated by the reflected light may be increased.

The second alignment mark AM2 of the flexible display panel 100 is aligned with a bending reference point RP5 in an area of the stacked structure in FIG. 12, using the fifth alignment image displayed on the camera 810. A bending reference point RP5 may be defined relative to the second surface of the metal plate 600, without being limited thereto. The stacked structure of FIG. 11 may be bent dispose the second area A2 of the flexible display panel 100 at an accurate position relative to the metal plate 600 and to avoid multiple bending attempts thereby reducing or effectively preventing defects such as cracks in the fan-out signal lines in the second area A2 which may also be bent in the fifth assembling process.

A module assembly of the flexible display apparatus may be completed by the above assembling processes.

According to one or more of the exemplary embodiments, the flexible display apparatus includes alignment marks each having stacked portions of a plurality of metal layers fabricated from the same plurality of metal layers used in manufacturing processes of the thin film transistor and the touch sensor. In the module-assembling processes of the flexible display apparatus, a clear alignment mark image may be obtained by the alignment marks having a structure in which portions of a plurality of metal layers are stacked. Therefore, an accuracy of the module-assembling processes may be improved.

One or more exemplary embodiments may be applied to a display device and an electronic device which has the display device. One or more exemplary embodiments, for example, may be applied to a computer monitor, a laptop, a digital camera, a cellular phone, a smart phone, a smart pad, a television, a personal digital assistant, a portable multimedia player ("PMP"), a MP3 player, a navigation system, a game console, a video phone, etc.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A flexible display apparatus comprising:
   a flexible display panel comprising:
      a thin film transistor arranged in a display area on a flexible substrate,
      an organic light emitting layer disposed on the thin film transistor,
      a touch sensor electrode disposed on the organic light emitting layer,
      a plurality of metal layers within the thin film transistor and the touch sensor electrode, and
      a first alignment mark in which patterns of at least two metal layers from among the plurality of metal layers are stacked in a peripheral area on the flexible substrate which is adjacent to the display area;
   a window member disposed on a first surface of the flexible display panel and comprising a transmissive window corresponding to the display area, and a light shielding part corresponding to the peripheral area; and
   a protective film disposed on a second surface opposite to the first surface of the flexible display panel.

2. The flexible display apparatus of claim 1, wherein the flexible display panel further comprises:
   an extension area extending from the peripheral area, and
   a plurality of fan-out lines connected to a plurality of signal lines arranged in the display area, and a plurality of pads connected to the plurality of fan-out lines, in the extension area.

3. The flexible display apparatus of claim 2, wherein a second alignment mark in which at least two metal layers are stacked is disposed on an edge portion of the extension area.

4. The flexible display apparatus of claim 3, further comprising:
   a circuit mounting film connected to the plurality of pads of the extension area; and
   a flexible circuit board connected to the circuit mounting film.

5. The flexible display apparatus of claim 3, further comprising a polarizing member disposed between the flexible display panel and the window member.

6. The flexible display apparatus of claim 5, wherein the polarizing member, the window member, and the protective film are disposed in alignment with the flexible display panel using the first alignment mark.

7. The flexible display apparatus of claim 3, wherein the display area of the flexible display panel is folded along a folding axis defined in a central area.

8. The flexible display apparatus of claim 3, wherein the first and second alignment marks comprise a first layer, a second layer, a third layer and a fourth layer sequentially stacked on the flexible substrate.

9. The flexible display apparatus of claim 3, wherein
   the thin film transistor comprises a gate electrode and a source electrode,
   the touch sensor electrode includes a first touch electrode and a second touch electrode,
   a first layer of the first and second alignment marks is disposed on a same layer as the gate electrode,
   a second layer of the first and second alignment marks is disposed on a same layer as the source electrode,
   a third layer of the first and second alignment marks is disposed on a same layer as the first touch electrode, and
   a fourth layer of the first and second alignment marks is disposed on a same layer as the second touch electrode.

10. The flexible display apparatus of claim 4, further comprising a metal plate disposed on the protective film,
   wherein the metal plate is disposed on the extension area where the flexible display panel is bent.

11. The flexible display apparatus of claim 10, wherein the circuit mounting film, the flexible circuit board and the metal plate are aligned with the flexible display panel using the second alignment mark.

12. The flexible display apparatus of claim 1, wherein the flexible substrate comprises a first transparent plastic layer, a colored plastic layer, and a second transparent plastic layer that are sequentially stacked.

* * * * *